US008975116B2

United States Patent
Ostmann et al.

(10) Patent No.: US 8,975,116 B2
(45) Date of Patent: Mar. 10, 2015

(54) ELECTRONIC ASSEMBLY INCLUDING AN EMBEDDED ELECTRONIC COMPONENT

(75) Inventors: Andreas Ostmann, Berlin (DE); Dionysios Manessis, Berlin (DE); Lars Böttcher, Berlin (DE); Stefan Karaszkiewicz, Berlin (DE)

(73) Assignees: Technische Universität Berlin, Berlin (DE); Fraunhofer-Gesellschaft zur Foerderung der angewandt Forschung e.V., Munich (DE)

( * ) Notice: Subject to any disclaimer, the term of this patent is extended or adjusted under 35 U.S.C. 154(b) by 279 days.

(21) Appl. No.: 13/515,137

(22) PCT Filed: Dec. 14, 2010

(86) PCT No.: PCT/EP2010/007628
§ 371 (c)(1),
(2), (4) Date: Oct. 5, 2012

(87) PCT Pub. No.: WO2011/082778
PCT Pub. Date: Jul. 14, 2011

(65) Prior Publication Data
US 2013/0015572 A1    Jan. 17, 2013

(30) Foreign Application Priority Data
Dec. 15, 2009   (DE) .................. 10 2009 058 764

(51) Int. Cl.
*H01L 21/00*         (2006.01)
*H05K 1/18*          (2006.01)
(Continued)

(52) U.S. Cl.
CPC ............ *H05K 1/188* (2013.01); *H01L 21/4832* (2013.01); *H01L 21/56* (2013.01);
(Continued)

(58) Field of Classification Search
USPC ................. 438/106, 118, 119, 612–614, 618; 257/E23.021, E23.069, E23.02, 257/E23.033, E23.034, E23.125
See application file for complete search history.

(56) References Cited

U.S. PATENT DOCUMENTS 5,877,559 A * 3/1999 Takayama et al. ............ 257/773
6,770,971 B2 * 8/2004 Kouno et al. .................. 257/734
(Continued)

FOREIGN PATENT DOCUMENTS

DE    112005001414 T5    5/2007
DE    102006036728 A1    2/2008
(Continued)

OTHER PUBLICATIONS

International Search Report and Written Opinion issued in PCT/EP2010/007628, mailed Jul. 1, 2011, with English translation of SR and WO, 41 pages.

*Primary Examiner* — Jasmine Clark
(74) *Attorney, Agent, or Firm* — Faegre Baker Daniels LLP

(57) ABSTRACT

An electronic unit is produced including at least one electronic component at least partially embedded in an insulating material. A film assembly is provided with at least one conductive layer and a carrier layer. The conductive layer includes openings in the form of holes for receiving bumps, which are connected to contact surfaces of the at least one electronic component. The at least one component is placed on the film assembly such that the bumps engage with the openings of the conductive layer. The at least one component is partially embedded from the side opposite of the bumps into a dielectric layer. The carrier layer of the film assembly is removed such that the surface of the bumps is exposed. A metallization layer is then deposited on the side of the remaining conductive layer having the exposed bumps and so as to produce conductor tracks that overlap with the bumps.

19 Claims, 2 Drawing Sheets

(51) Int. Cl.
    *H01L 21/48* (2006.01)
    *H01L 21/56* (2006.01)
    *H01L 23/00* (2006.01)
    *H01L 23/31* (2006.01)
    *H05K 3/02* (2006.01)

(52) U.S. Cl.
    CPC ............... *H01L 24/24* (2013.01); *H01L 24/32* (2013.01); *H01L 24/82* (2013.01); *H01L 24/83* (2013.01); *H01L 24/29* (2013.01); *H01L 23/3107* (2013.01); *H01L 24/16* (2013.01); *H01L 24/28* (2013.01); *H01L 24/81* (2013.01); *H01L 2221/68377* (2013.01); *H01L 2223/54426* (2013.01); *H01L 2224/13144* (2013.01); *H01L 2224/13147* (2013.01); *H01L 2224/13155* (2013.01); *H01L 2224/13164* (2013.01); *H01L 2224/2402* (2013.01); *H01L 2224/81121* (2013.01); *H01L 2224/81801* (2013.01); *H01L 2224/83192* (2013.01); *H01L 2224/838* (2013.01); *H01L 2224/92* (2013.01); *H01L 2924/01013* (2013.01); *H01L 2924/01029* (2013.01); *H01L 2924/01046* (2013.01); *H01L 2924/0105* (2013.01); *H01L 2924/01057* (2013.01); *H01L 2924/01079* (2013.01); *H01L 2924/01082* (2013.01); *H05K 3/025* (2013.01); *H05K 2201/0969* (2013.01); *H05K 2201/09745* (2013.01); *H05K 2203/0353* (2013.01); *H01L 2224/136* (2013.01); *H01L 2224/2919* (2013.01); *H01L 2924/00013* (2013.01); *H01L 2924/01005* (2013.01); *H01L 2924/01023* (2013.01); *H01L 2924/0665* (2013.01)
    USPC ........... 438/106; 438/118; 438/119; 438/612; 438/618; 257/E23.02; 257/E23.033; 257/E23.125

(56) References Cited

U.S. PATENT DOCUMENTS

| | | | |
|---|---|---|---|
| 7,011,989 B2 * | 3/2006 | Becker et al. | 438/113 |
| 8,042,724 B2 | 10/2011 | Ostmann et al. | |
| 8,240,032 B2 | 8/2012 | Iihola et al. | |
| 2004/0043533 A1 | 3/2004 | Chua et al. | |
| 2006/0049530 A1 * | 3/2006 | Hsu | 257/784 |
| 2007/0108610 A1 * | 5/2007 | Kondo | 257/737 |
| 2007/0227761 A1 | 10/2007 | Tuominen et al. | |
| 2007/0273046 A1 * | 11/2007 | Theuss | 257/783 |
| 2008/0206926 A1 * | 8/2008 | Sakamoto et al. | 438/110 |

FOREIGN PATENT DOCUMENTS

| | | |
|---|---|---|
| DE | 102008009220 A1 | 8/2009 |
| JP | 2008270633 A | 11/2008 |
| WO | WO2006134217 A1 | 12/2006 |
| WO | WO2009127780 A1 | 10/2009 |

* cited by examiner

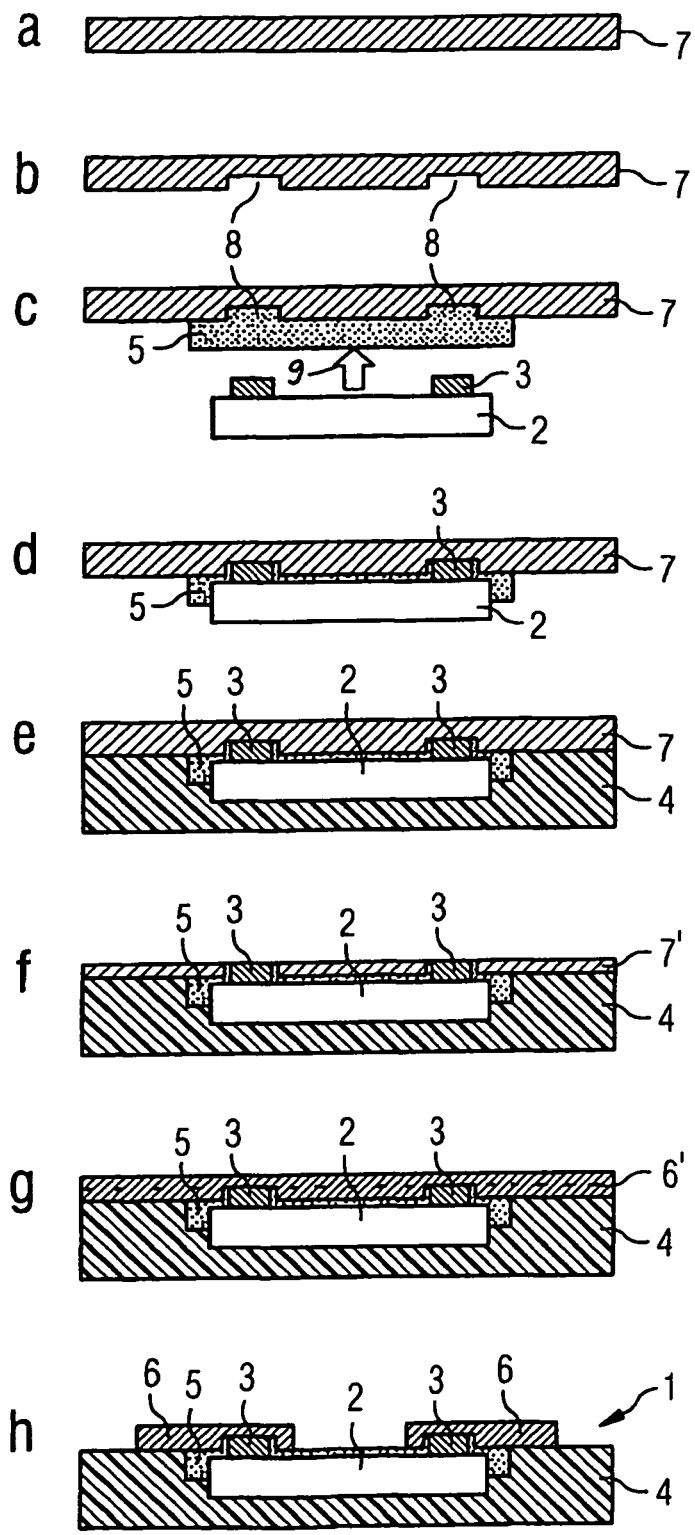

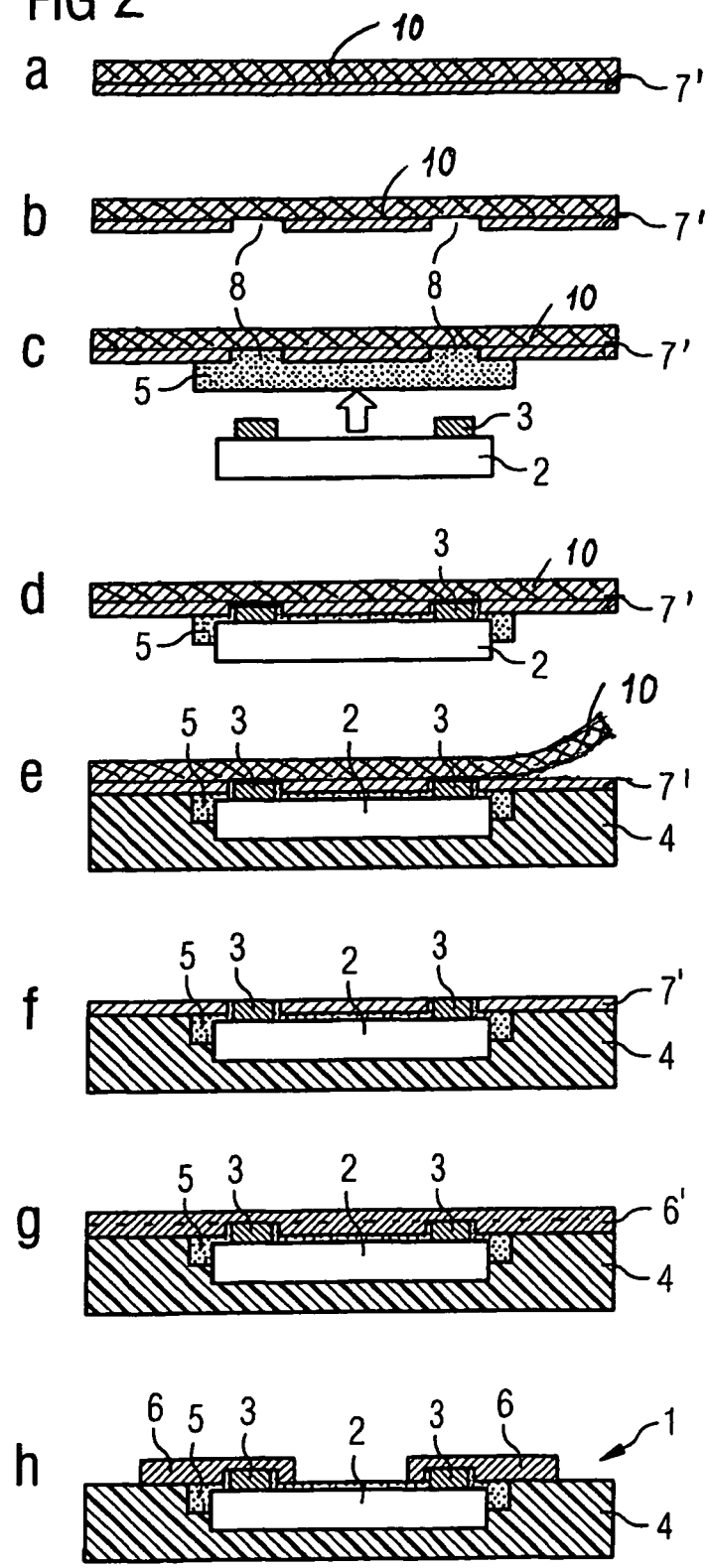

ELECTRONIC ASSEMBLY INCLUDING AN EMBEDDED ELECTRONIC COMPONENT

The invention relates to a method for manufacturing an electronic assembly, with which at least one electronic component is at least partly embedded into an insulating material, and to an electronic assembly manufactured according to the method.

The integration or embedding of thin semiconductor components into dielectrics of circuit boards in a multi-layer construction and which are contacted via galvanised Cu-connections (vias), are playing an increasingly important role in the course of the further development of product miniaturisation.

A series of methods for embedding semiconductor components into organic substances already exists, and these methods to some extent are already applied with manufacture. These may be divided into methods, with which the chip with its structured side is applied to the top or to the bottom onto a carrier. The latter mentioned method is particularly well suited for embedding components with a fine contact raster, since the dielectric thickness between chip contacts and the carrier may be controlled particularly well with it.

For example, a method for embedding electronic components is described in U.S. Publication 2007/0227761, with which the electronic component is applied onto a film arrangement of a conductive layer and carrier film by way of an adhesive layer and is surrounded by an insulating mass. The carrier layer is removed and holes are drilled from the side of the conductive layer, in order to create a connection to the bumps or the contact surfaces of the at least one electronic component. Subsequently, the conductive layer is provided with a metallisation and both are structured according to specifications.

A significantly feature with the known methods lies in the fact that a drilling of a hole from the surface to the chip contacts or contacts of the electronic components is always necessary. This entails a series of disadvantages. With this, it is necessary to geometrically bring three elements into a matching position (chip contact, via and strip conductor). Moreover, inherent of the process, a lower limit is placed on the size of the holes to the components to be embedded, by which means the smallest achievable contact raster is limited. Finally, the galvanic filling of the hole with metal, generally copper, limits the aspect ratio which may be achieved, i.e. holes with a small diameter must also have a corresponding low depth, which in turn significantly increases the demands with regard to the control of the dielectric thickness.

It is the object of the invention to provide a method for the manufacture of an electronic assembly, which is suitable for small contact rasters of the components to be embedded and simplifies method steps.

According to the invention, this object is achieved in each case by the features of the independent claims.

Advantageous further developments of improvements are possible by way of the measures specified in the dependent claims.

Due to the fact, that with the method for manufacturing an electronic assembly, at least one electronic components is applied onto a conductive layer or onto a film arrangement of a conductive layer and a carrier layer, wherein the conductive layer comprises openings in the form of blind holes or through-holes, into which bumps connected to contact surfaces of the electronic component engage, and a previously deposited non-conductive adhesive layer fixes the component, that the at least one component from the side opposite the bumps is at least partly embedded into the dielectric layer and subsequently a part of the conductive layer or the carrier layer of the film arrangement is removed in a manner such that the surface of the bumps is exposed and that a metallisation layer is deposited onto the side of the conducive layer with the exposed bumps, which is subsequently structured in order to create conductor tracks which overlap with the bumps, one may create an electronic assembly, with which the components may be embedded with a significantly smaller contact raster than in the state of the art. With the method according to the invention, lower demands are placed on the geometric accuracy of the process steps, since amongst other things, the bumps and conductor tracks from now on only need to have an overlap, i.e. the bump does not need to lie within the strip conductor width. It is sufficient if only a part of the strip conductor is congruent to the bump. No vias need to be produced, wherein the limitations which this entails are done away with and as a whole the method costs are reduced. Moreover, the thickness of the construction is reduced due to the absence of the vias.

The invention is realised by the two basic embodiments which are specified in the independent claims. In the one embodiment, a conductive layer is provided as a starting material and this layer may be designed as a film and as the case may be, may also be indicated as a film arrangement. This conductive layer, preferably of copper, is provided with openings which are etched or structured into the layer in a depth-controlled manner as blind holes.

In another embodiment, the starting material is the film arrangement of two layers, the conductive layer and the carrier layer, preferably of different materials, i.e. instead of a homogeneous, for example copper film, a thin film is applied on a carrier, wherein the carrier layer is formed from a polymer ceramic or from a metal such as aluminium. With this variant, the openings are manufactured in a manner such that as holes, they go through the conductive layer, wherein the film arrangement in its entirety is provided with the holes from the side of the conductive layer, i.e. etched or structured in a depth-controlled manner.

As an advantageous variant, the removal of a part of the conductive layer or of the carrier layer may be effected in both cases by way of etching away, wherein one etches in a depth-controlled manner on the side which is opposite to the dielectric layer, in order to expose the bumps in the holes of the conductive film. The carrier layer may however also be pulled away, in particular if consists of a polymer or has ceramic constituents.

Advantageously, the metallisation layer is deposited onto the conductive layer and the exposed bumps amid the use of the same material as the conductive layer, by which means a uniform metal layer arises, which creates an excellent contacting to the bumps. The bumps thereby advantageously consist of copper or of copper with a tin layer, or however also of nickel and palladium (Ni/Pd) or also of gold, wherein however a similarly contact-capable metallisation or alloy may be used. Thereby, the bumps may be protected with the help of an etching-resistant layer which is removed before the deposition of the metallisation layer. This entails the advantage that the bumps are not damaged on removing the carrier layer or a part of the conductive layer.

Advantageously, the blind holes in the conductive layer are created with a depth which is smaller than the height of the bumps, or the thickness of the conductive layer of the film arrangement is smaller than the height of the bumps, by which means the subsequent contacting to the metallisation layer is improved. An "abutment" is given in the Z-direction due to the "insertion" of the bumps into the blind holes etched in a depth-controlled manner or the holes of the conductive layer, and this abutment on the one hand is formed by the blind hole base and on the other hand by the carrier film. The thickness of the dielectric between the chip and the Cu-film is set in a precise manner by way of this. This leads to improved reliability values since there is no danger of a layer which is too thin.

Advantageously, the openings in the conductive layer may be applied as adjustment markings when applying or placing the electronic component or the at least one component, so that a positionally accurate arrangement is possible without further constructions. Each opening may receive a bump or an opening in each case, or an opening or a hole may be designed in each case such that several bumps may be accommodated, depending on the construction of the contacting surfaces of the component. This may be effected if the bump distance is very small, for example the bumps may be designed as a frame along the periphery of the chip.

One embodiment example of the invention is represented in the drawing and explained in more detail in the subsequent description. There are shown in:

FIG. 1 a sequence of method steps for manufacturing an assembly according to the invention and according to one embodiment, FIG. 2 a sequence of method steps for manufacturing an assembly according to the invention and according to another embodiment.

One embodiment example of the electronic assembly according to the invention is shown schematically in FIG. 1*h*, wherein the electronic assembly 1 comprises the electronic component 2 with contactings which are designed as bumps 3 with the manufacturing method, a dielectric layer 4 and a non-conductive adhesive layer 5, into which the component 2 is embedded, and conductive tracks 6 which partly overlap with the bumps 3 or the contactings.

The manufacture of the component 1 is now described by way of the method steps in FIGS. 1*a* to 1*h*.

The starting point is a film arrangement which is provided according to FIG. 1*a*, wherein this film arrangement is a copper film 7 in the embodiment example. The copper film 7 is structured in a manner, i.e., is structured in a depth-controlled manner such that openings 8 designed as blind holes are formed (FIG. 1*b*). An adhesive layer 5 is deposited onto the structured copper film at least in the region of the fastening to the component 2, and the component 2 which was previously provided with the metallic protuberances or bumps 3 on its contact surfaces, is applied with the front side or upper side to the bottom, on or onto the adhesive layer 5 and onto the copper film 7, according to the arrow 9, in a manner such that the bumps 3 engage into the openings or the blind holes 8 which simultaneously serve for adjusting the component 2 on the copper film 7. The assembled condition of the component on the copper film 7 and on the adhesive layer 5 is represented in FIG. 1*d*.

According to FIG. 1*e*, the arrangement according to FIG. 1 *d*, from the side of the component 2 which is away from the contactings, is pressed with a dielectric layer 4, by which means the component 2 is partly embedded into the dielectric layer 4 and the adhesive layer 5. The dielectric layer is e.g., a thin plate, called prepreg which is placed on. The arrangement is then pressed in a vacuum lamination press which is common in circuit board technology. The prepreg e.g., consists of epoxy resin reinforced with glass fibre fabric. The dielectric layer may however be manufactured in a different manner, e.g., by way of a cast mass.

According to FIG. 1*f*, the copper film 7 is etched away in a depth controlled manner to such an extent, that the surface of the bumps 3 is exposed, wherein a conductive layer 7' remains, In the case that the bumps 3 were provided with an etching-resistant layer beforehand for their protection, this layer is removed or the complete surface of the conductive layer 7' as well as that of the bumps 3 is cleaned, so that possible residues on the bump surface as well as on the surface of the conductive layer are removed. Subsequently, according to FIG. 1*g*, a copper layer is deposited on the exposed surface 7', by which means, together with the conductive layer 7', a common thicker metallisation layer 6' results. This metallisation layer 6' is structured in a manner, such that the desired conductor tracks 6 arise, which overlap with the bumps 3 for their contacting.

Another embodiment example is represented in FIGS. 2*a* to *h*, wherein, instead of the homogeneous copper film 7, a thin copper film, corresponding for example to the conductive layer 7' according to FIG. 1*f*, is provided, which is connected to a carrier layer 10 for example by way of a thin adhesive layer. Thereby the carrier film 10 may consist of the most varied of materials, e.g., may be designed as a polymer layer, layer with ceramic constituents or however also as a metal layer, e.g., aluminium layer. The openings 8 are structured as through-holes through the thin copper film 7' (FIG. 2*b*). The steps 2*c*) and 2*d*) correspond to those of FIGS. 1*c*) and 1*d*), wherein as with FIG. 1 *d*, a thin adhesive layer remains between the component 2 and the copper film. If for example the carrier layer 10 is designed as a polymer layer, it may be pulled off from the present thin copper film 7' according to FIG. 2*e*, so that the etching step (FIG. 1 *e*) is replaced by the pulling-off.

If a metal layer is used as a carrier layer 10, then this may be etched in a depth-controlled manner according to FIG. 1 *e*. Subsequently, with the presence of a protective layer on the bumps 2, this may be removed by way of etching, so that the contact surfaces of the bumps 3 are exposed as in FIG. 1*f*. The other processing steps are described as in the context with FIGS. 1*g* and 1*h*.

The invention claimed is:

1. A method for manufacturing an electronic assembly including at least one electronic component at least partly embedded in an insulating material, the method comprising:

structuring a conductive layer with openings for receiving bumps connected to contact surfaces of the at least one electronic component, the openings comprising blind holes;

depositing an adhesive layer onto a side of the conductive layer structured with the openings;

applying the at least one electronic component onto the conductive layer such that the bumps engage into the openings of the conductive layer;

partially embedding the at least one component into a dielectric layer from a side of the at least one electronic component opposite to the bumps;

removing a portion of the conductive layer such that surfaces of the bumps are exposed;

depositing a metallization layer onto the side of the conductive layer with the exposed bumps; and structuring the metallization layer and the conductive layer to form conductor tracks that overlap with the bumps.

2. The method of claim 1, wherein the step of structuring the conductive layer with openings comprises:

etching the openings into the conductive layer in a depth-controlled manner.

3. The method of claim 1, wherein the removing step comprises:

etching the conductive layer in a depth-controlled manner from a side of the conductive layer opposite to the openings.

4. The method of claim 1, wherein the step of depositing the metallization layer comprises depositing the metallization layer using the same material as the conductive layer.

5. The method of claim 1, wherein the at least one component is pressed with the dielectric layer.

6. The method of claim 1, wherein the step of structuring the conductive layer with openings comprises:
structuring the openings with a depth that is less than the height of the bumps.

7. The method of claim 1, wherein a thickness of the conductive layer is less than a height of the bumps.

8. The method of claim 1, wherein prior to the removing step, the method further comprises:
forming an etching-resistant layer on the bumps.

9. The method of claim 8, wherein prior to the step of depositing the metallization layer, the method further comprises:
removing the etching-resistant layer.

10. An electronic assembly manufactured according to the method of claim 1.

11. A method for manufacturing an electronic assembly including at least one electronic component at least partly embedded in an insulating material, the method comprising:
providing a film arrangement that includes a conductive layer and a carrier layer;
structuring the conductive layer with openings for receiving bumps connected to contact surfaces of the at least one electronic component, the openings comprising through-holes;
depositing an adhesive layer onto a side of the conductive layer structured with the openings;
applying the at least one electronic component onto the conductive layer such that the bumps engage into the openings of the conductive layer;
partially embedding the at least one component into a dielectric layer from a side of the at least one electronic component opposite to the bumps,
removing the carrier layer such that surfaces of the bumps are exposed;
depositing a metallization layer onto the side of the conductive layer with the exposed bumps; and
structuring the metallization layer and the conductive layer to form conductor tracks that overlap with the bumps.

12. The method of claim 11, wherein the step of depositing the metallization layer comprises depositing the metallization layer using a different material as the conductive layer.

13. The method of claim 11, wherein the removing step comprises:
etching or pulling-off the carrier layer.

14. The method of claim 11, wherein the step of depositing the metallization layer comprises depositing the metallization layer using the same material as the conductive layer.

15. The method of claim 11, wherein the at least one component is pressed with the dielectric layer.

16. The method of claim 11, wherein the step of structuring the conductive layer with openings comprises:
structuring the openings with a depth that is less than the height of the bumps.

17. The method of claim 11, wherein a thickness of the conductive layer is less than a height of the bumps.

18. The method of claim 11, wherein prior to the removing step, the method further comprises:
forming an etching-resistant layer on the bumps.

19. The method of claim 18, wherein prior to the step of depositing the metallization layer, the method further comprises:
removing the etching-resistant layer.

\* \* \* \* \*